(12) United States Patent
Clare et al.

(10) Patent No.: US 6,352,406 B1
(45) Date of Patent: Mar. 5, 2002

(54) METHOD FOR ASSESSING QUALITY OF A COATING PROCESS AND ASSEMBLY THEREFOR

(75) Inventors: James Hayward Clare, Crosby, TX (US); James Anthony Ruud, Albany; Robert John Zabala, Schenectady, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/362,596

(22) Filed: Jul. 28, 1999

(51) Int. Cl.[7] .............................................. F01D 25/00
(52) U.S. Cl. ................. 416/61; 416/241 R; 416/241 B
(58) Field of Search ............................... 416/61, 241 R, 416/241 B; 73/150 R, 866.4; 118/500, 502; 247/8, 9, 10

(56) References Cited

U.S. PATENT DOCUMENTS

| | | | |
|---|---|---|---|
| 4,271,005 A | * | 6/1981 | Wright et al. ............... 204/298 |
| 4,541,287 A | * | 9/1985 | Roper ......................... 73/827 |
| 5,329,810 A | | 7/1994 | Rogers et al. |
| 5,630,667 A | | 5/1997 | Ito |
| 5,792,267 A | * | 8/1998 | Marszal et al. ............. 118/500 |
| 6,072,568 A | * | 6/2000 | Paton et al. .................. 356/32 |
| 6,083,322 A | * | 7/2000 | Burns et al. ................ 118/730 |
| 6,165,542 A | * | 12/2000 | Jaworowski et al. .......... 427/10 |

FOREIGN PATENT DOCUMENTS

WO        11288        4/1996

OTHER PUBLICATIONS

European Search Report.

* cited by examiner

*Primary Examiner*—Edward K. Look
*Assistant Examiner*—Ninh Nguyen
(74) *Attorney, Agent, or Firm*—Paul J. DiConza; Noreen C. Johnson

(57) ABSTRACT

A method for assessing quality of a coating process includes providing a facsimile assembly, the facsimile assembly having a fixture holding an audit coupon, and coating the facsimile assembly to form a coating thereon. The assembly is then disassembled, and the coating on the audit coupon is inspected.

39 Claims, 1 Drawing Sheet

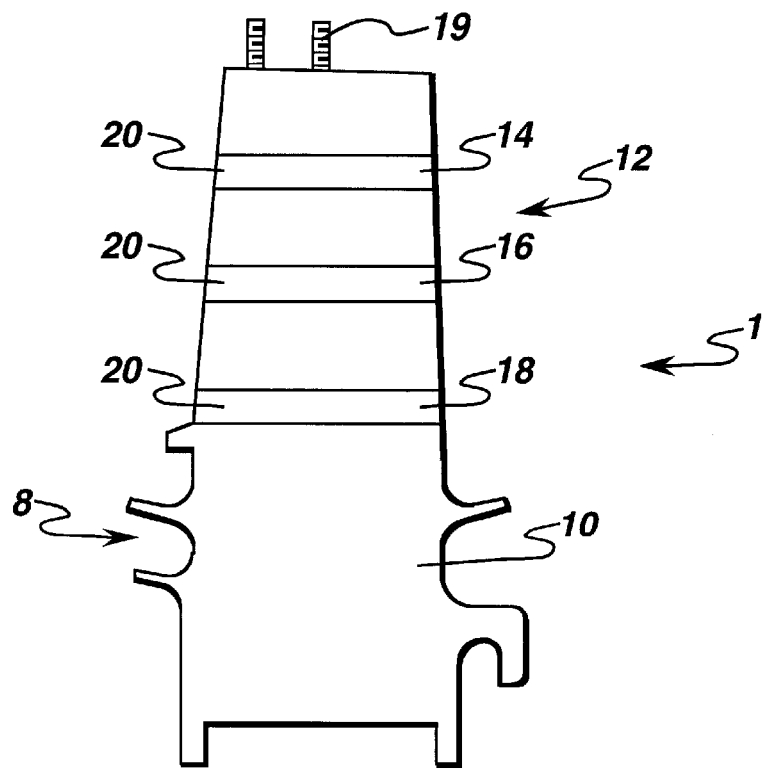
fig. 1
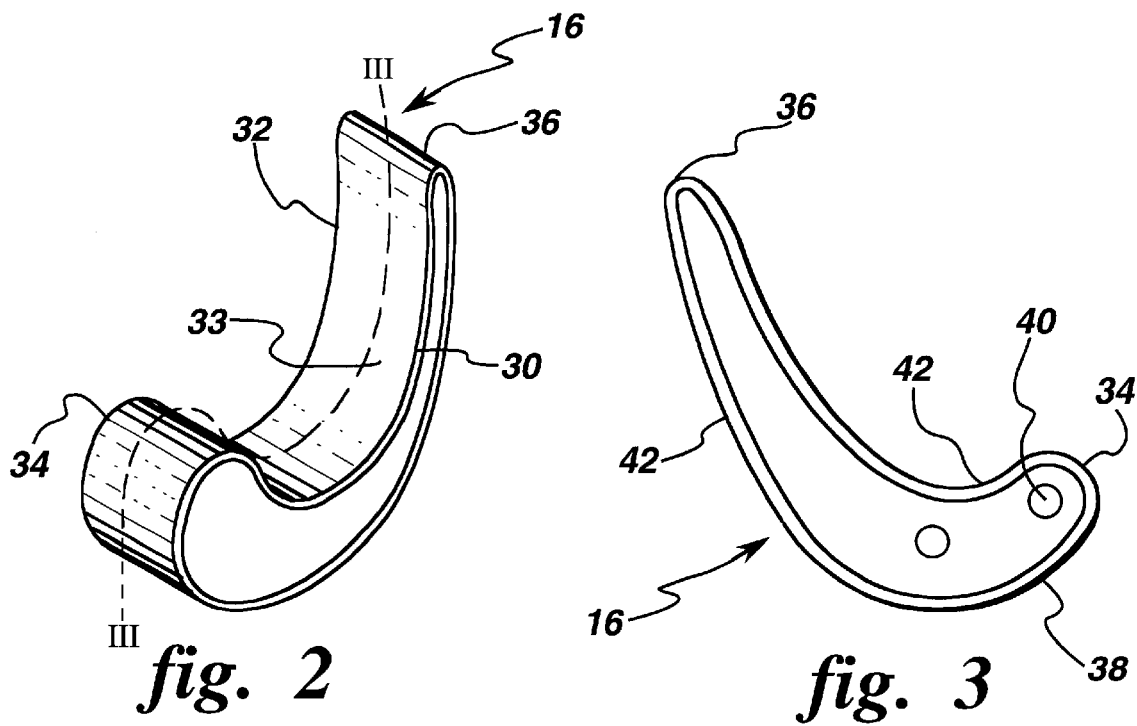
fig. 2
fig. 3

METHOD FOR ASSESSING QUALITY OF A COATING PROCESS AND ASSEMBLY THEREFOR

BACKGROUND OF THE INVENTION

The invention relates generally to a method for assessing the quality of a coating process. In particular, the invention relates to a method for assessing quality of a coating process by inspecting a coating formed thereby.

Coatings are commonly employed on various turbine engine components such as airfoils used in power generation as well as aircraft applications. Common coatings include thermal barrier coatings (TBCs), bond coats, and diffusion coatings, for example, and are formed of various materials including ceramics and metal alloys. Prior to scaled production, or a production run, the quality of such coatings is generally inspected to ensure that the coating meets certain requirements, such as microstructure, thickness, and density tolerances. A common technique for inspecting the quality of a coating, and hence the quality of the coating process, is to first coat a sacrificial part and inspect the coating thereof before proceeding with processing a batch of multiple parts.

In the case of turbine engine components, for example, testing is usually carried out by a destructive process, that is, a process which does not leave the part intact and which sacrifices the part under test. Typically, for a turbine airfoil, the blade portion of the airfoil is divided or sectioned into two or more samples, so as to expose cross-sections of the coating. The microstructure and thickness of the coating are then analyzed at several locations along the cross-section to determine whether production with the current processing parameters can proceed.

Typically, the sacrificial airfoil is provided from a pool of defective hardware that was scrapped after either casting or machining. However, particularly for mature hardware designs, scrap hardware can be in limited supply. In such a case, a new part must be produced or purchased for the destructive quality control measurements. The long-term cost of purchasing such parts can be prohibitive. In addition, delays in production can result due to lack of availability of such parts.

While alternative, non-destructive testing processes have been explored for replacing the above-described destructive testing process, it has been shown to be largely unsatisfactory. Attempts to correlate coating thickness distribution statistically along inaccessible regions of a coated part have proved largely unreliable. Attempts at correlating total weight gain of the part do not provide adequate spatial information along the surface contours of the part. Further, particularly for metallic coatings, non-destructive techniques have not yet been developed having requisite accuracy for thickness. For both ceramic and metallic coatings, there are no known non-destructive evaluation methods that adequately characterize the microstructure of the coatings.

Accordingly, a need exists in the art for improved techniques for assessing quality of a coating process, particularly, for coating processes used in connection with turbine engine components under production.

SUMMARY OF THE INVENTION

According to one aspect of the invention, a method for assessing quality of a coating process includes the steps of providing a facsimile assembly, the facsimile assembly having a fixture holding an audit coupon, and coating the facsimile assembly to form a coating thereon. Following coating the assembly, the assembly is disassembled, and the coating on the audit coupon is inspected.

According to another aspect of the invention, a turbine engine component facsimile assembly includes a fixture holding an audit coupon, the facsimile assembly replicating a turbine engine component.

BRIEF DESCRIPTION OF THE DRAWINGS

FIG. 1 illustrates a facsimile assembly of an airfoil for a turbine engine;

FIG. 2 illustrates an audit coupon of the facsimile assembly shown in FIG. 1; and FIG. 3 is a cross-section along line III–III' shown in FIG. 2.

DETAILED DESCRIPTION OF THE INVENTION

According to an embodiment of the present invention, a method for assessing the quality of a coating process includes the use of a facsimile assembly. As used herein, the term "facsimile assembly" refers to a modular assembly that replicates a production component in terms of dimensions and surface contours. The facsimile assembly includes a fixture that holds an audit coupon, typically a plurality of audit coupons. The audit coupons are generally formed of a metal alloy that is similar in composition to the turbine airfoil material and that is adapted to withstand the environmental conditions (e.g., temperature) used during the coating process. In the case of a turbine engine component such as an airfoil that is subjected to high temperatures (e.g., above 1100° F.), the component is generally formed of a high performance alloy such as a cobalt-based or nickel-based superalloy.

Turning to FIG. 1, an example of a facsimile assembly 1 is illustrated, including fixture 8, which supports a plurality of audit coupons 14, 16 and 18. The fixture 8 includes base 10 and threaded rods 19, which are threaded into complementary threaded cylindrical openings (not shown) within base 10. Threaded rods 19 extend axially through the audit coupons. In addition to base 10 and threaded rods 19, the fixture 8 further includes spacers 20 which are employed to axially space the audit coupons from each other. Alternately, the coupons can be suspended on the threaded rods at specific axial positions without spacers. However, for coating processes in which the coating build-up can be affected by rebound of material from adjacent surfaces, such as thermal spray, the use of spacers more closely replicates the airfoil surface.

The fixture 8 is reusable, and is generally fabricated from a single sacrificial airfoil. Particularly, an airfoil is obtained and sectioned so as to remove portions of the airfoil corresponding to audit coupons 14, 16, and 18. The sectioning then leaves behind base 10 and spacers 20. The base 10 is then modified to receive threaded rods 19, by tapping the base or by inserting threaded cylindrical fittings. Although the distal ends of threaded rods 19 depicted in FIG. 1 are threaded for receiving a conjugate nut, the distal ends may be replaced with screw-heads or the like for driving threaded rods into the base 10. Alternatively, the threaded rods may be permanently attached to the base by use of welding or other techniques. It is noted that the particular means of attachment of the audit coupons and spacers to the base 10 is not particularly critical, provided that means of attachment does not interfere with the coating process.

Particularly, it is important that the attachment means does not cover critical outer contoured portions of the audit coupons that are to be examined following the coating process, or otherwise does not affect the coating process along those portions.

The audit coupons are fabricated so as to have surface contours that closely mimic the surface contours of the sections of the airfoil that they represent, particularly, the surface contours of blade portion 12. In one embodiment, the audit coupons are fabricated by utilizing a CAD (computer-aided drawing) model of the airfoil, and manipulating the model to form three-dimensional representations of the audit coupons. The data from the computer model are then utilized to fabricate the audit coupons. Various techniques may be utilized, including machining, such as wire electro-discharge machining (EDM), as well as abrasive cutting, such as abrasive water jet cutting. During the fabrication step, the audit coupons are formed so as to have axial through holes, which align with the positions of the rods 19 of the fixture 8.

Following fabrication of the audit coupons, the facsimile assembly is assembled and subjected to the coating process. The coating process may be one of several that is used for turbine engine components. Exemplary coating processes include vapor deposition, which generally includes chemical vapor deposition (CVD) and physical vapor deposition (PVD), thermal spray techniques, generally including flame spraying, HVOF (high-velocity oxy-fuel), APS (air plasma spraying), and wire arc spraying. Additionally, the coating may be applied by slurry techniques, or by the pack cementation process. The coating is typically chosen from several coatings used on turbine engine components, including bond coats, thermal barrier coatings (TBC's), diffusion coatings, diffusion-barrier coatings, corrosion-resistant coatings, oxidation-resistant coatings, wear-resistant coatings, and erosion-resistant coatings.

The coating is generally an alloy or a ceramic material. Typical alloys for turbine engine components are nickel-based or cobalt-based, wherein nickel or cobalt is the single greatest element by weight percent in the coating. Methods for assessing quality of the coating according to embodiments of the present invention are particularly adapted for alloy coatings such as nickel-based or cobalt-based coatings, as non-destructive techniques for measuring thickness and microstructure for metal-based coatings on metal-based substrates are largely unavailable.

Turning to FIG. 2, a peripheral view of audit coupon 16 of FIG. 1 is illustrated. As shown, the audit coupon 16 has a generally curved contour, including leading edge 34, trailing edge 36, and lateral peripheral edges 30 and 32. The lateral peripheral edges 30 and 32 may be chamfered to assist in preventing unwanted bridging of the coating formed according to the coating process or gaps can be inserted between the coupons and the adjacent spacers.

According to the embodiment shown in the drawings, the coating is inspected along points that are interior to the lateral peripheral edges 30 and 32. Particularly, a coating is inspected along cross-section shown by line III–III'. In order to inspect the audit coupon along this cross-section, portion 33 is removed. Removal may be carried out by various techniques, such as by machining or grinding the audit coupon 16.

The cross section along line III–III' is depicted in FIG. 3. As illustrated, audit coupon 16 has a coating 38, and through holes 40. The coating 38 is inspected at a number of interior inspection points 42. While two inspection points 42 are shown in FIG. 3, any number of inspection points may be employed. The particular locations of the inspection points are chosen based upon various parameters, including local surface contours, high curvature areas (small radius of curvature regions), and other critical regions of the airfoil.

Following each HVOF treatment, a cobalt nickel chromium aluminum yttrium (CoNiCrAlY) coating was formed. Cross-sections were taken of each of the three audit coupons on each of the facsimile assemblies, as well as the production airfoils. The same inspection points on each audit coupon were examined in terms of coating thickness distribution and microstructural characterizations. It was found that there was no significant difference in thicknesses and microstructures of the coatings as measured at the inspection points between the various test specimens (facsimile assemblies) and the control specimens. Accordingly, it was confirmed that the facsimile assemblies according to embodiments of the present invention provided accurate data representing the quality of the coating process under examination. Inspection is typically carried out by examination of microstructure and thickness by light microscopy.

Following inspection, according to embodiments of the present invention, the fixture may be reused. Typically, the coating of the fixture is removed prior to assembly with a new set of audit coupons, although it may be possible to use the same fixture for multiple runs before the coating is removed. Removal of the coating is typically carried out by mechanical means, such as by abrasive grit blasting, or by chemical means, such as by etching. In the case of chemical etching, the choice of etchant is largely dependent on the composition of the coating as well as the substrate (i.e., the fixture). Thus, according to embodiments of the present invention, the reusable fixture generally only requires the sectioning and destruction of only a single sacrificial part for multiple qualifications of production runs.

EXAMPLES

A facsimile assembly replicating a 6B stage 1 airfoil (alternatively referred to as a "bucket") for a power generation gas turbine was fabricated. A sacrificial bucket was sectioned utilizing wire electro-discharge machining (EDM) into three segments, generally corresponding to the audit coupons 14, 16 and 18 illustrated in FIG. 1. After removal of the three segments, the material left behind included a base and three spacers generally corresponding to base 10 and spacers 20 illustrated in FIG. 1. Audit coupons were then fabricated by wire electro-discharge machining of a ⅜" thick IN718 sheet. The profile for the coupons was generated from a computer solid model of the airfoil casting.

Following fabrication of the audit coupons, the facsimile assembly replicating the original bucket was assembled. A threaded rod was inserted through the stack of audit coupons and spacers to constrain the fixture axially, the rod engaging a threaded cylindrical insert provided in the base. Rather than a second threaded rod as shown in FIG. 1, a series of dowel pins was provided to anchor each audit coupon and spacer to maintain rotational alignment. Each dowel pin extended through the coupon to the spacers adjacent to the coupon and into the base, but they were not threaded.

A small separation or gap between audit coupons and spacers of the fixture was provided in order to prevent the coating from bridging the components and allow rapid disassembly of the fixture without cutting or chipping the coating on the audit coupons. Placing steel washers around the threaded rod and dowel pin, between the fixture segments (spacers) and the audit coupons achieved a ¹⁄₁₆"

separation. The facsimile assembly was mounted in an HVOF cell utilizing the same masking and positioning of production buckets.

Additional examples were prepared for the coating process. A second example was prepared following the procedure outlined above, except that the audit coupons were fabricated by abrasive water jet cutting, rather than EDM. A third example was assembled from the segments of the original sacrificial bucket. In addition, two production buckets were employed as control specimens.

While embodiments of the present invention have been described above with particular detail, it is understood that one of ordinary skill in the art may modify aspects thereof without departing from the scope of the appended claims.

What is claimed:

1. A method for assessing quality of a coating process comprising the steps of:
   providing a facsimile assembly, the facsimile assembly comprising a fixture holding an audit coupon;
   coating the facsimile assembly to form a coating thereon;
   disassembling the facsimile assembly; and
   inspecting the coating on the audit coupon.

2. The method of claim 1, wherein the facsimile assembly is a replica of a turbine engine component.

3. The method of claim 2, wherein the turbine engine component is an airfoil.

4. The method of claim 2, wherein the facsimile assembly comprises a plurality of auditcoupons.

5. The method of claim 4, wherein the audit coupons are stacked on each other and held together by the fixture.

6. The method of claim 5, wherein the fixture comprises at least one rod which holds the audit coupons together.

7. The method of claim 6, wherein the fixture further comprises at least one spacer inserted between the audit coupons.

8. The method of claim 6, wherein the fixture further comprises a base for supporting the audit coupons and through which the at least one rod extends.

9. The method of claim 2, wherein the audit coupon has an lateral peripheral edge, and the coating at an interior inspection point is inspected, the interior inspection point being located inside the lateral peripheral edge of the audit coupon.

10. The method of claim 9, wherein a cross-section of the coating is inspected, the cross-section intersecting the interior inspection point.

11. The method of claim 10, wherein a portion of the audit coupon along the lateral peripheral edge is removed to expose the interior inspection point.

12. The method of claim 11, wherein said portion is removed by machining the audit coupon.

13. The method of claim 10, wherein the audit coupon has plural interior inspection points.

14. The method of claim 2, wherein the facsimile assembly comprises a plurality of audit coupons, the audit coupons replicating portions of the turbine engine component.

15. The method of claim 14, wherein the audit coupons are fabricated by machining.

16. The method of claim 15, wherein the machining is electro-discharge machining.

17. The method of claim 14, wherein the audit coupons are fabricated by abrasive waterjet cutting.

18. The method of claim 14, wherein the audit coupons are formed by replicating portions of the turbine engine component using a computer model of the turbine engine component.

19. The method of claim 2, wherein the coating step is repeated with a new audit coupon assembled with the fixture.

20. The method of claim 19, wherein before the coating step is repeated, an existing coating is removed from the fixture.

21. The method of claim 2, wherein the coating comprises an alloy or ceramic material.

22. The method of claim 21, wherein the coating comprises an alloy selected from the group consisting of a nickel-base alloy and a cobalt-base alloy.

23. The method of claim 21, wherein the coating is selected from a group consisting of a bond coat, thermal barrier coating, diffusion coating, diffusion barrier coating, corrosion-resistant coating, oxidation-resistant coating, wear-resistant coating, and erosion-resistant coating.

24. The method of claim 21, wherein the coating is formed on the facsimile assembly by a technique from the group consisting of vapor deposition, thermal spray, cementation pack deposition, or slurry deposition.

25. A method for assessing quality of a coating process comprising the steps of:
   providing a facsimile assembly of an airfoil of a turbine engine, wherein the facsimile assembly (i) comprises a fixture holding a plurality of audit coupons and (ii) replicates the airfoil;
   coating the facsimile assembly to form a coating thereon;
   disassembling the facsimile assembly; and
   inspecting at least one of coating thickness and coating microstructure of an audit coupon.

26. The method of claim 25, wherein said audit coupon has an lateral peripheral edge, and the coating at an interior inspection point is inspected, the interior inspection point being located inside the lateral peripheral edge.

27. The method of claim 26, wherein a cross-section of the coating is inspected, the cross-section intersecting the interior inspection point.

28. The method of claim 27, wherein a portion of the audit coupon along the lateral peripheral edge is removed to expose the interior inspection point.

29. The method of claim 28, wherein said portion is removed by machining.

30. The method of claim 28, wherein the audit coupon has plural interior inspection points.

31. The method of claim 25, wherein the audit coupons are stacked on each other and held together by the fixture.

32. A turbine engine component facsimile assembly comprising a fixture holding an audit coupon, the facsimile assembly replicating a turbine engine component.

33. The assembly of claim 32, wherein the fixture comprises at least one rod.

34. The assembly of claim 32, wherein the assembly comprises a plurality of audit coupons.

35. The assembly of claim 34, wherein the fixture further comprises at least one spacer inserted between the audit coupons.

36. The assembly of claim 35, wherein the fixture further comprises a base for supporting the audit coupons, through which the at least one rod extends.

37. The assembly of claim 32, wherein the turbine engine component is an airfoil.

38. The assembly of claim 37, wherein the airfoil has a blade portion and a base, wherein the audit coupon replicates the blade portion.

39. A turbine engine airfoil facsimile assembly comprising a fixture holding a plurality of audit coupons, the facsimile assembly replicating a turbine engine airfoil having a base and a blade portion, wherein the audit coupons are stacked on each other and replicate the blade portion.

* * * * *